(12) United States Patent
Lee et al.

(10) Patent No.: US 6,775,527 B2
(45) Date of Patent: Aug. 10, 2004

(54) SQUELCH CIRCUIT WITH ADJUSTABLE REFERENCE LEVEL

(75) Inventors: Chien-Hsiung Lee, Hsinchu (TW); Kun-Chih Chang, Hsinchu (TW)

(73) Assignee: Faraday Technology Corp., Hsinchu (TW)

( * ) Notice: Subject to any disclaimer, the term of this patent is extended or adjusted under 35 U.S.C. 154(b) by 438 days.

(21) Appl. No.: 10/047,798

(22) Filed: Jan. 14, 2002

(65) Prior Publication Data

US 2003/0083029 A1 May 1, 2003

(51) Int. Cl.[7] ................................................ H04B 1/10
(52) U.S. Cl. ...................... 455/220; 455/222; 455/218; 455/212
(58) Field of Search ................................ 455/218, 212, 455/296, 63.1, 67.11, 67.13, 222, 220; 327/63, 101, 96; 365/189.09; 330/253, 252

(56) References Cited

U.S. PATENT DOCUMENTS

| | | | | |
|---|---|---|---|---|
| 4,186,354 A | * | 1/1980 | Page | 330/252 |
| 4,893,349 A | * | 1/1990 | Eastmond et al. | 455/205 |
| 4,991,227 A | * | 2/1991 | Kehler, Jr. | 455/221 |
| 5,142,244 A | * | 8/1992 | Glica et al. | 330/253 |
| 5,315,549 A | * | 5/1994 | Scherpenberg et al. | 365/189.09 |
| 6,070,063 A | * | 5/2000 | Yoshizawa et al. | 455/234.1 |
| 6,184,726 B1 | * | 2/2001 | Haeberli et al. | 327/96 |
| 6,486,710 B1 | * | 11/2002 | Simoni | 327/63 |
| 2003/0001627 A1 | * | 1/2003 | Simoni | 327/101 |

* cited by examiner

*Primary Examiner*—Edward F. Urban
*Assistant Examiner*—Lana Le
(74) *Attorney, Agent, or Firm*—J. C. Patents

(57) ABSTRACT

A squelch circuit with an adjustable reference level, having an input level comparator with a first, a second, a third and a fourth current input terminal, a first and a second input terminal, and an output terminal. A first current source is coupled between the first current input terminal and an operation voltage. A second current source is coupled between the second current input terminal and the operation voltage. A third current source is coupled between the third current input terminal and a ground terminal. A fourth current source is coupled between the fourth current input terminal and the ground terminal. A bias generator is coupled to the first, second, third and fourth current sources to generate current control signals thereto according to a reference current and control bits, such that the first, second, third and fourth current sources generate the same current, which adjusts the reference level.

3 Claims, 4 Drawing Sheets

SQUELCH CIRCUIT WITH ADJUSTABLE REFERENCE LEVEL

BACKGROUND OF THE INVENTION

1. Field of the Invention

The invention relates in general to a squelch circuit, and more particularly, to a squelch circuit with an adjustable input level.

2. Description of the Related Art

A squelch circuit is a circuit designed to prevent input signal noise interference, and is used in the prior art to resolve the problems of too muchnoise from comparator. Referring to FIG. 1a, the operation theory of a conventional comparator is shown. As shown in FIG. 1, when the conventional comparator receives a positive input voltage, a voltage of logic 1 is output. If the conventional comparator receives a negative input voltage, a voltage of logic 0 is output. A serious drawback of the conventional comparator is that an error output results when the input terminal is interfered by noise. That is, even when the conventional comparator does not receive a positive input voltage, a voltage of logic 1 may be output instead of the voltage of logic 0 which is supposed to be output. The output voltage of logic 1 is caused by noise instead of the real input voltage. Thus, once the comparator is interfered by noise, the output is unstable. To improve this situation, a squelch circuit has been designed.

Referring to FIG. 1b, the operation theory of a conventional squelch circuit is illustrated. When a conventional squelch circuit receives an input voltage larger than the reference level $V_{THP}$, a voltage of logic 1 is output. If the conventional squelch circuit receives an input voltage smaller than the level $V_{THP}$, a voltage of logic 0 is output. Referring to FIG. 1c, assuming that the input signal of the conventional squelch circuit has a waveform as shown, the conventional squelch circuit outputs a voltage of logic 1 at the portion larger the input level $V_{THP}$, and outputs a voltage of logic 0 at the portion smaller than the input level $V_{THP}$.

Referring to FIG. 2, a schematic circuit diagram of a conventional squelch circuit is shown. Such structure will achieve the above objective, that is, connecting the input positive signal to the input terminal INP, and connecting the input negative signal to the input terminal INN. When the input signal ($V_{INP}-V_{INN}$) is larger than the reference level $V_{THP}$, the output terminal OUT of the comparator 10 outputs a voltage level of logic 1. In contrast, the output terminal OUT of the comparator 10 outputs a voltage level of logic 0 when the input signal is smaller than the reference level $V_{THP}$. The above reference level $V_{THP}$ is defined as follows. The squelch circuit has an operation voltage of Vdd. The resistance of the resistors R2, R1, R3, R4, R5, R6, R7, R8 is $R_2$, $R_1$, $R_3$, $R_4$, $R_5$, $R_6$, $R_7$, $R_8$, the voltage of the input terminal INP and INN is $V_{INP}$ and $V_{INN}$, respectively, and the node voltage for nodes NP and PN is $V_{NP}$ and $V_{PN}$, respectively. The input terminal of the comparator 10 receives the voltages of the nodes NP and PN to compare, and the compared result is output from the output terminal OUT. That is, the voltage difference $V_{INP}-V_{INN}$ and the reference level $V_{THP}$ are compared. In addition, assuming that $R_1/(R_1+R_2)=R_7/(R_7+R_8)$, $R_1=R_5$, $R_2=R_6$, $R_3=R_7$, $R_4=R_8$, the structure in the analytic drawing in FIG. 2 has the following relations:

$V_{PN}=V_{INP}-(Vdd/2)(R_7/(R_7+R_8))$ $V_{NP}=V_{INN}+(Vdd/2)(R_1/(R_1+R_2))$

When $V_{PN}=V_{NP}$, $V_{THP}=V_{INP}-V_{INN}=(Vdd)/(R_1/(R_1+R_2))$. Therefore, the reference level $V_{THP}$ of the conventional squelch circuit is related to the operation voltage Vdd, $R_1$, and $R_2$. The reference level of the conventional squelch circuit is not programmable, and so, being easily affected by the operation voltage Vdd, the reference level $V_{THP}$ is not precise.

SUMMARY OF THE INVENTION

The present invention provides a squelch circuit with an adjustable reference level. The squelch circuit comprises a reference level comparator, which further includes a first, a second, a third and a fourth current input terminal, a first and a second input terminal and an output terminal. A first current source is coupled between the first current input terminal and an operation voltage. A second current source is coupled between the second current input terminal and the operation voltage. A third current source is coupled between the third current input terminal and a ground terminal. A fourth current source is coupled between the fourth current input terminal and the ground terminal. A bias generator is coupled to the first, second, third and fourth current input terminals to generate control signals according to a reference current and control bits, so that the first, second, third and fourth current sources generate the current, which adjusts the reference level.

Both the foregoing general description and the following detailed description are exemplary and explanatory only and are not restrictive of the invention, as claimed.

DESCRIPTION OF THE PREFERRED EMBODIMENTS

Figure 1A:
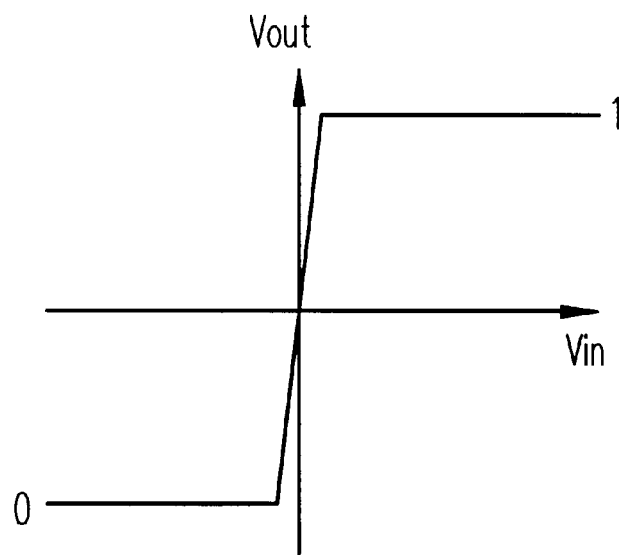
FIG. 1a shows the operation theory of a conventional comparator.
Figure 1B:
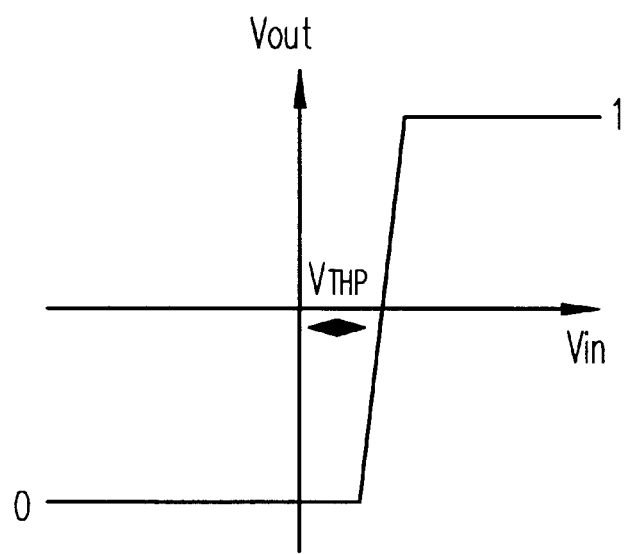
FIG. 1b shows the operation theory of a conventional squelch circuit.
Figure 1C:
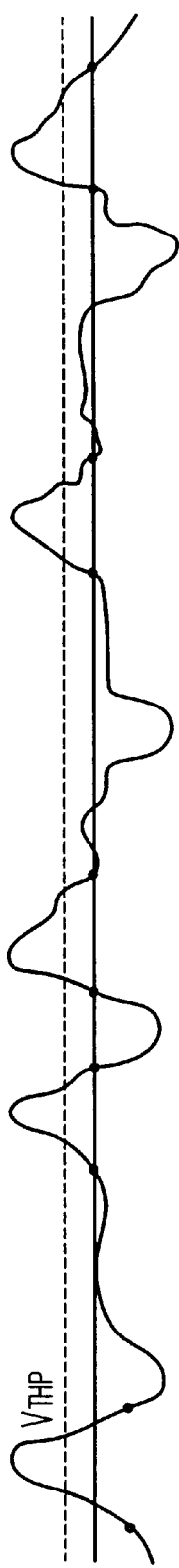
FIG. 1c shows a waveform diagram of an input signal of the conventional squelch circuit.
Figure 2:
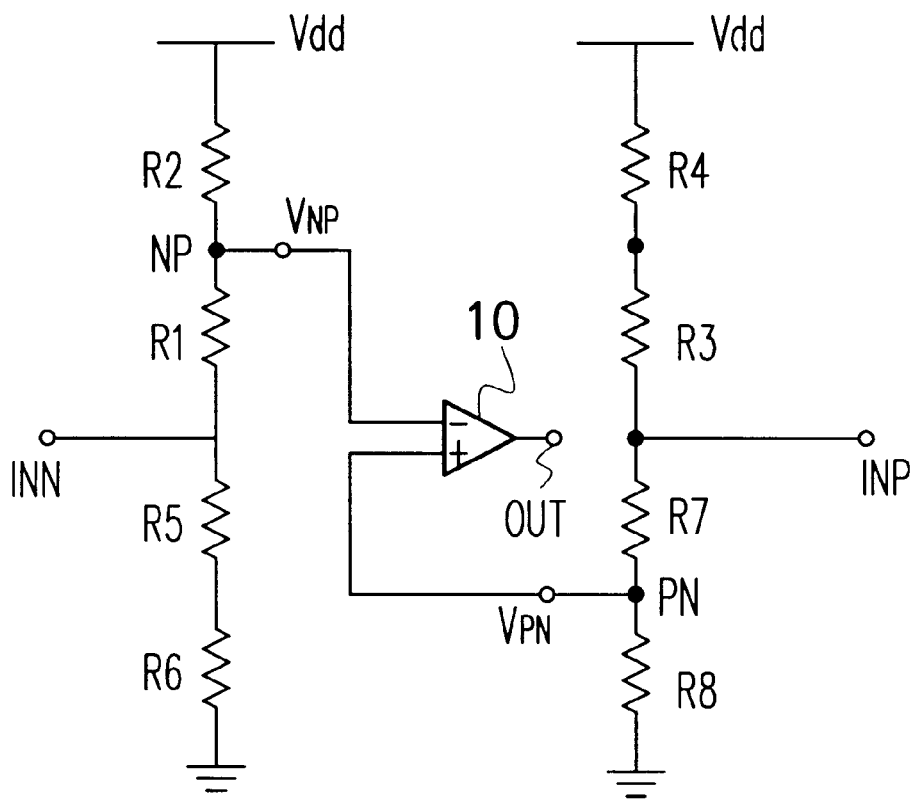
FIG. 2 shows a circuit diagram of a conventional squelch circuit.
Figure 3:
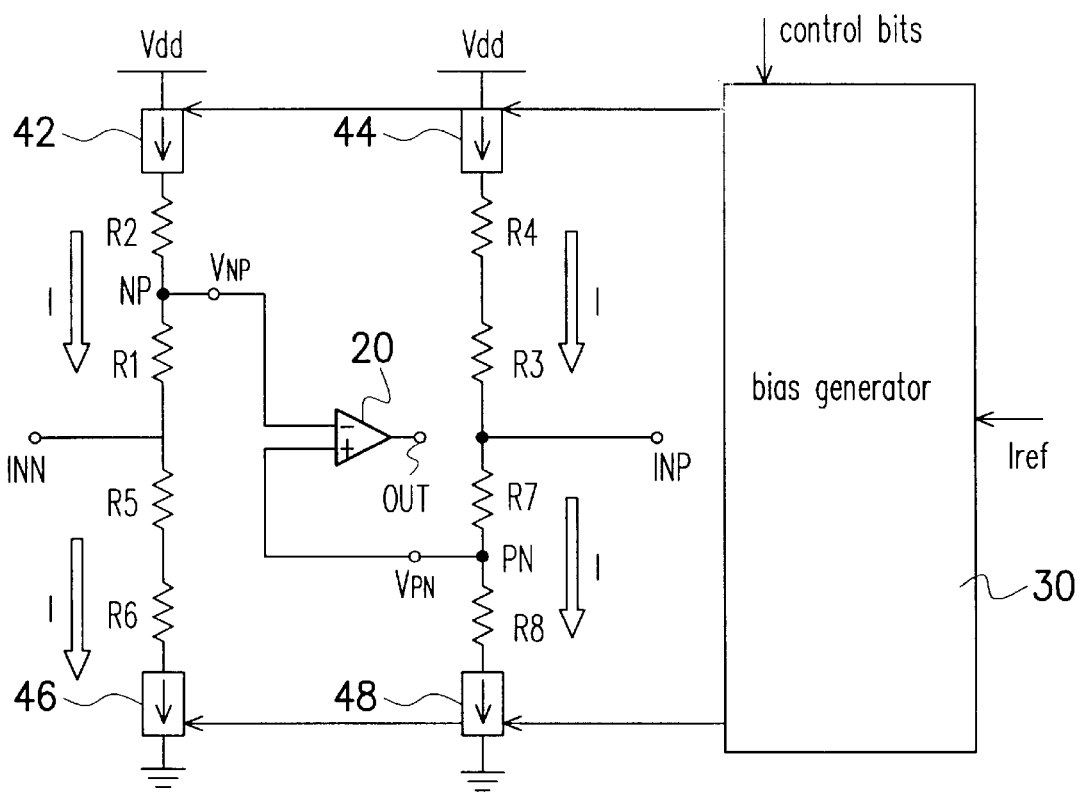
FIG. 3 shows a schematic structure of a squelch circuit with an adjustable reference level in one preferred embodiment of the present invention.

Referring to FIG. 3, the schematic structure of a squelch circuit with an adjustable reference level in one preferred embodiment of the present invention is shown.

The squelch circuit with an adjustable reference level of the present invention can be used to adjust the reference level $V_{THP}$. The squelch circuit comprises a bias generator 30, current sources 42, 44, 46, 48, resistors R1 to R8, terminal nodes PN and NP, and input terminals INN and INP. The bias generator 30 is used to output current bias signals to each of the current sources 42, 44, 46 and 48. The current source 42 has a first terminal coupled to an operation voltage Vdd, a second terminal coupled to the bias generator 30, and a third terminal coupled to a first terminal of the resistor R2. A second terminal of the resistor R2 is coupled to the terminal node NP. The resistor R1 has a first terminal coupled to the terminal node NP and a second terminal coupled to the input terminal INN. The resistor R5 has a first terminal coupled to the input terminal INN. The resistor R6 has a first terminal coupled to a second terminal of the resistor R5. The current source 46 has a first terminal coupled to a second terminal of the resistor R6, a second terminal coupled to the bias generator 30, and a third terminal coupled to the ground voltage.

The current source 44 has a first terminal coupled to the operation voltage Vdd, a second terminal coupled to the bias generator 30, and a third terminal coupled to a first terminal of the resistor R4. The resistor R3 has a first terminal coupled to a second terminal of the resistor R4, and a second terminal coupled to the input terminal INP. The resistor R7 has a first terminal coupled to the input terminal INP, and a second terminal coupled to the terminal node PN. The resistor R8 has a first terminal coupled to the terminal node PN, and a second terminal coupled to a first terminal of the current source 48, a second terminal of which is coupled to the bias generator 30, and a third terminal of which is coupled to the ground voltage.

The squelch circuit with adjustable reference level further comprises a comparator 20 coupled to the terminal nodes PN and NP. In addition, the bias generator 30 outputs current bias signals according to a reference current and control bits. Further, the above input terminal INN is a negative input terminal.

When the reference level of the squelch circuit with an adjustable reference level receives an input voltage larger than the reference level $V_{THP}$, a voltage of logic 1 is output, while when the input voltage is smaller than the reference level $V_{THP}$, a voltage of logic 0 is output. Using the structure of the squelch circuit with an adjustable reference level, the input positive signal is connected to the input terminal INP. The input negative signal is connected to the input terminal INN. The reference level is then adjusted. When the input signal ($V_{INP}-V_{INN}$) is larger then the reference level $V_{THP}$, a voltage of logic 1 is output from the output terminal OUT. When the input signal ($V_{INP}-V_{INN}$) is smaller then the reference level $V_{THP}$, a voltage of logic 0 is output from the output terminal OUT. The reference level $V_{THP}$ is configured as follows. The operation voltage of the squelch circuit with the adjustable reference level is defined as Vdd, while the currents generated by the current sources 42, 44, 46 and 48 are all I. Since the current I is generated according to the control bit k and the reference current Iref received from the bias generator, the current I, the control bits k and the reference current Iref have the relationship of I=k*Iref. k is programmable and controllable. The resistances of the resistors R1, R2, R3, R4, R5, R6, R7 and R8 are denoted as $R_1$, $R_2$, $R_3$, $R_4$, $R_5$, $R_6$, $R_7$ and $R_8$. The input terminal INP has a voltage of $V_{INP}$. The input terminal INN has a voltage of $V_{INN}$. The terminal node NP has a voltage of $V_{NP}$. The terminal node PN has a voltage of $V_{PN}$. Therefore:

$$V_{PN}=V_{INP}-I*R_7$$

$$V_{NP}=V_{INN}+I*R_1$$

When $V_{PN}=V_{NP}$, $V_{INP}-V_{INN}=V_{THP}=I*R_1+I*R_7=k*Iref*(R_1+R_7)$. Assuming that $R_1/m=R_7/n=R_x$, where m, n and $R_x$ are constants, $V_{THP}=k*Iref*R_x*(m+n)$. Assuming that Iref= $V_x/R_x$, since $R_x$ is a constant, Iref is a constant, so that $V_x$ is also a constant. Consequently, $V_{THP}=k*V_x*(m+n)$. Therefore, $V_{THP}$ is only affected by k since $V_x$, m and n are all constants. Since k is programmable, $V_{THP}$ is also programmable.

Accordingly, the present invention has the following advantages:

1. $V_{THP}$ is irrelevant to the operation voltage Vdd since $V_{THP}=k*V_x*(m+n)$, and $V_x$, m and n are constants. Therefore, $V_{THP}$ is only related to k.
2. Since $V_{THP}=k*V_x*(m+n)$, and $V_x$, m and n are constants, $V_{THP}$ is only related to k. As k is programmable and controllable, $V_{THP}$ is also programmable and can be precisely adjusted.

3. Since the input resistances are $R_{42}+R_1+R_2//R_{46}+R_6+R_5$, and $R_{42}$ and $R_{46}$ are the resistances of the current sources 42 and 46, respectively, the input impedance of the squelch circuit with the adjustable reference level is large.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A squelch circuit with an adjustable reference level, the squelch circuit comprising:
   an input level comparator, having a first, a second, a third and a fourth current input terminal, a first and a second input terminal, and an output terminal, wherein input signals for the first and the second input terminals are inverted;
   a first current source, coupled between the first current input terminal and an operation voltage;
   a second current source, coupled between the second current input terminal and the operation voltage;
   a third current source, coupled between the third current input terminal and a ground terminal;
   a fourth current source, coupled between the fourth current input terminal and the ground terminal; and
   a bias generator, coupled to input terminals of the first, second, third and fourth current sources to generate current bias signals to each of the first, second, third and fourth current sources, so that the first, second, third and fourth current sources generate the current, which adjusts the reference level.

2. The squelch circuit according to claim 1, wherein the input level comparator further comprises:
   a first resistor, having a first terminal coupled to the first current source and a second terminal;
   a second resistor, having a first terminal coupled to the second terminal of the first resistor, and a second terminal coupled to the first input terminal of the reference level comparator;
   a third resistor, having a first terminal coupled to the first input terminal of the reference level comparator, and a second terminal;
   a fourth resistor, having a first terminal coupled to the second terminal of the third resistor, and a second terminal coupled to the third current source;
   a fifth resistor, having a first terminal coupled to the second current source and a second terminal;
   a sixth resistor, having a first terminal coupled to the second terminal of the fifth resistor and a second terminal coupled to the second input terminal of the reference level comparator;
   a seventh resistor, having a first terminal coupled to the second input terminal of the reference level comparator and a second terminal; and
   an eighth resistor, having a first terminal coupled to the second terminal of the seventh resistor and a second terminal coupled to the fourth current source.

3. The squelch circuit according to claim 1, wherein the input level comparator further comprises:
   a comparator, having a first input terminal coupled to the second terminal of the first resistor, a second input terminal coupled to the second terminal of the seventh resistor; and
   an output terminal.

* * * * *